United States Patent
Chen et al.

(10) Patent No.: US 9,503,071 B2
(45) Date of Patent: Nov. 22, 2016

(54) CIRCUIT FOR PROVIDING DUMMY LOAD

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Yuan-Xi Chen, Shenzhen (CN); Ying-Bin Fu, Shenzhen (CN); Ya-Jun Pan, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 869 days.

(21) Appl. No.: 13/861,410

(22) Filed: Apr. 12, 2013

(65) Prior Publication Data
US 2013/0300212 A1   Nov. 14, 2013

(30) Foreign Application Priority Data
May 11, 2012   (CN) .......................... 2012 1 0145408

(51) Int. Cl.
*H03K 17/00*   (2006.01)
*H03K 17/22*   (2006.01)

(52) U.S. Cl.
CPC ............ *H03K 17/00* (2013.01); *H03K 17/223* (2013.01); *Y10T 307/747* (2015.04)

(58) Field of Classification Search
CPC . H03K 17/00; H03K 17/223; Y10T 307/747
See application file for complete search history.

(56) References Cited

U.S. PATENT DOCUMENTS

| | | | | |
|---|---|---|---|---|
| 4,373,140 A | * | 2/1983 | Chin | G01R 19/04 324/103 P |
| 5,739,712 A | * | 4/1998 | Fujii | H03F 1/523 327/103 |
| 2002/0059536 A1 | * | 5/2002 | Saeki | G06F 1/10 713/500 |
| 2008/0159562 A1 | * | 7/2008 | Liu | H04R 3/007 381/94.5 |

* cited by examiner

*Primary Examiner* — Zeev V Kitov
(74) *Attorney, Agent, or Firm* — Zhigang Ma

(57) ABSTRACT

A circuit for providing a dummy load includes first to fifth resistors, a comparator, and first to fifth electronic switches. When a power good signal from a power supply is at a low level signal, the first electronic switch is turned off. The second to fourth electronic switches are turned on. The fifth electronic switch is turned off. When the power good signal from the power supply is at a high level signal, the first electronic switch is turned on. The second to fourth electronic switches are turned off. The fifth electronic switch is turned off.

10 Claims, 1 Drawing Sheet

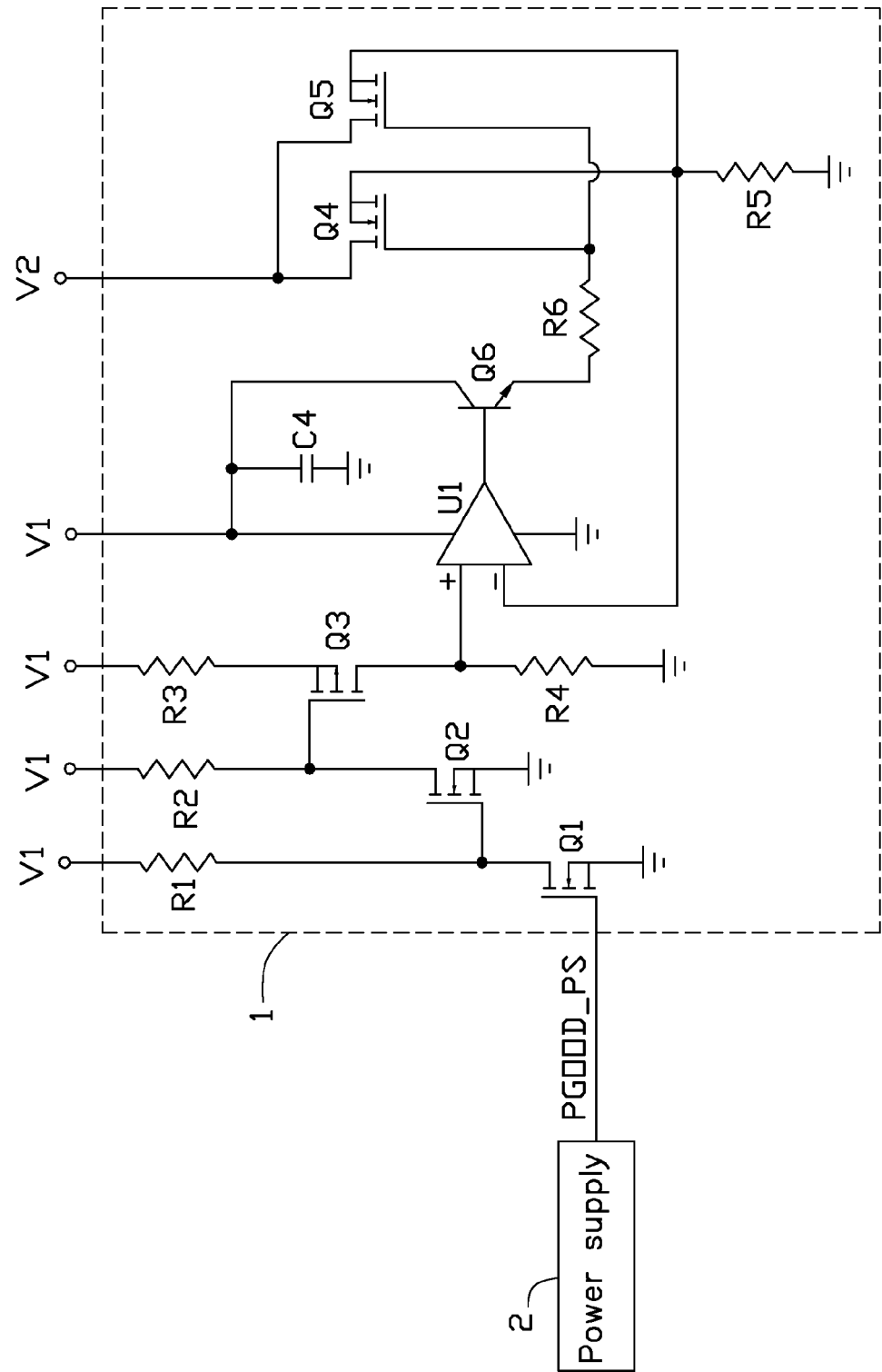

CIRCUIT FOR PROVIDING DUMMY LOAD

BACKGROUND

1. Technical Field

The present disclosure relates to a circuit for providing dummy loads.

2. Description of Related Art

According to the characteristics of power supplies, many conditions must be met for the power supply to function properly. However, two important conditions are that a power on signal PS_ON is at a low level, and the power supply has a load. However, when the power supply outputs a voltage to electronic elements of a motherboard, the electronic elements begin to work only after a delay, such that the load of the power supply is zero. As a result, the power supply may be turned off.

BRIEF DESCRIPTION OF THE DRAWING

Many aspects of the embodiments can be better understood with reference to the following drawing. The components in the drawing are not necessarily drawn to scale, the emphasis instead being placed upon clearly illustrating the principles of the present embodiments. Moreover, in the drawing, like reference numerals designate corresponding parts throughout the several views.

The FIGURE is a circuit diagram of an embodiment of a circuit for providing a dummy load.

DETAILED DESCRIPTION

The disclosure, including the accompanying drawing, is illustrated by way of examples and not by way of limitation. It should be noted that references to "an" or "one" embodiment in this disclosure are not necessarily to the same embodiment, and such references mean at least one.

The FIGURE shows an embodiment of a circuit 1 for providing a dummy load. The circuit 1 includes metal-oxide-semiconductor field effect transistors (MOSFETs) Q1-Q5, a bipolar junction (BJT) transistor Q6, resistors R1-R6, a comparator U1, and a capacitor C4.

A power supply 2 supplies power good signal PGOOD_PS to a gate of the MOSFET Q1. A source of the MOSFET Q1 is grounded. A drain of the MOSFET Q1 is connected to a first voltage terminal V1 of the power supply 2 through the resistor R1. The drain of the MOSFET Q1 is also connected to a gate of the MOSFET Q2. A source of the MOSFET Q2 is grounded. A drain of the MOSFET Q2 is connected to the first voltage terminal V1 through the resistor R2. The drain of the MOSFET Q2 is also connected to a gate of the MOSFET Q3. A source of the MOSFET Q3 is connected to the first voltage terminal V1 through the resistor R3. A drain of the MOSFET Q3 is grounded through the resistor R4.

The drain of the MOSFET Q3 is also connected to a non-inverting input terminal of the comparator U1. An inverting input terminal of the comparator U1 is connected to sources of the MOSFETs Q4 and Q5 and also grounded through the resistor R5. A power terminal of the comparator U1 is connected to the first voltage terminal V1 and also grounded through the capacitor C4. A ground terminal of the comparator U1 is grounded. An output terminal of the comparator U1 is connected to a base of the transistor Q6. A collector of the transistor Q6 is connected to the first voltage terminal V1. An emitter of the transistor Q6 is connected to gates of the MOSFETs Q4 and Q5 through the resistor R6. Drains of the MOSFETs Q4 and Q5 are connected to a second voltage terminal V2 of the power supply 2. In the embodiment, the MOSFETs Q1, Q2, Q4, and Q5 are n-channel MOSFETs, and the MOSFET Q3 is a p-channel MOSFET.

When the power supply 2 is at a standby state, the power good signal PGOOD_PS from the power supply 2 is at a low level. The MOSFET Q1 is turned off. The MOSFETs Q2 and Q3 are turned on. A voltage of the non-inverting input terminal of the comparator U1 is equal to a voltage between two terminals of the resistor R4. At the same time, a voltage at the inverting input terminal of the comparator U1 is at a low level, such that the comparator U1 outputs a high level signal. As a result, the transistor Q6 is turned on, and the MOSFETs Q4 and Q5 are turned on. The second voltage V2 is outputted to the resistor R5 through the MOSFETs Q4 and Q5. In one embodiment, resistance of the resistor R5 is 1 ohm. A current flowing through the resistor R5 is 0.5 amperes. In other embodiments, one of the MOSFETs Q4 and Q5 can be omitted, to save cost.

When the voltage of the non-inverting input terminal of the comparator U1 is equal to the voltage of the inverting input terminal of the comparator U1, the output terminal of the comparator U1 outputs a low level signal. The transistor Q6 is turned off. The MOSFETs Q4 and Q5 are turned off. The second voltage V2 is not provided to the resistor R5. Namely, the resistor R5 functions as a dummy load and is connected to the power supply 2. Thus, when a motherboard supplied power by the power supply 2 is powered on, the power supply 2 is at a work state.

After the motherboard is powered on, the power good signal PGOOD_PS from the power supply 2 is at a high level signal. The MOSFET Q1 is turned on. The MOSFETs Q2 and Q3 are turned off. The non-inverting input terminal of the comparator U1 receives a low level signal. The output terminal of the comparator U1 outputs a low level signal. The transistor Q6 is turned off. The MOSFETs Q4 and Q5 are turned off. The second voltage V2 is not provided to the resistor R5, to save energy.

In the embodiment, the MOSFETs Q1-Q5 and the BJT transistor Q6 are electronic switches. In other embodiments, the MOSFET Q1-Q5 may be BJT transistors, and the BJT transistor Q6 may be a MOSFET. A base of the BJT transistor is corresponding to the gate of the MOSFET, a collector of the BJT transistor is corresponding to the drain of the MOSFET, and an emitter of the BJT transistor is corresponding to the source of the MOSFET.

The foregoing description of the exemplary embodiments of the disclosure has been presented only for the purposes of illustration and description and is not intended to be exhaustive or to limit the disclosure to the precise forms disclosed. Many modifications and variations are possible in light of everything above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A circuit applicable to provide a dummy load, the circuit comprising:

first to fifth resistors;
a comparator comprising a non-inverting input terminal, an inverting input terminal, and an output terminal;
a first electronic switch comprising a control terminal to receive a power good signal from a power supply, a first terminal grounded, and a second terminal to receive a first voltage from the power supply through the first resistor;
a second electronic switch comprising a control terminal connected to the second terminal of the first electronic switch, a first terminal grounded, and a second terminal to receive the first voltage through the second resistor;
a third electronic switch comprising a control terminal connected to the second terminal of the second electronic switch, a first terminal to receive the first voltage through the third resistor, and a second terminal grounded through the fourth resistor and also connected to the non-inverting input terminal of the comparator;
a fourth electronic switch comprising a first terminal connected to the inverting input terminal of the comparator and also grounded through the fifth resistor, a second terminal to receive a second voltage from the power supply, and a control terminal; and
a fifth electronic switch comprising a control terminal connected to the output terminal of the comparator, a first terminal to receive the first voltage from the power source, and a second terminal connected to the control terminal of the fourth electronic switch;
wherein when the power good signal from the power supply is at a low level signal, the first electronic switch is turned off, the second to fourth electronic switches are turned on, the fifth electronic switch is turned on; when the power good signal from the power supply is at a high level signal, the first electronic switch is turned on, the second to fourth electronic switches are turned off, the fifth electronic switch is turned off.

2. The circuit of claim 1, further comprising a sixth resistor, wherein the second terminal of the fifth electronic switch is connected to the control terminal of the fourth electronic switch through the sixth resistor.

3. The circuit of claim 1, further comprising a sixth electronic switch, wherein the sixth electronic switch comprises a first terminal connected to the inverting input terminal of the comparator, a second terminal to receive the second voltage from the power supply, and a control terminal connected to the control terminal of the fourth electronic switch.

4. The circuit of claim 3, wherein the first to fourth electronic switches, and the sixth electronic switch are a metal-oxide-semiconductor field effect transistor (MOSFET), the control terminal and the first and second terminals of each of the first to fourth electronic switches, and the sixth electronic switch are corresponding to a gate, a source, and a drain of the MOSFET, respectively.

5. The circuit of claim 4, wherein the first and second electronic switches, the fourth electronic switch, and the sixth electronic switch are n-channel MOSFETs, and the third electronic switch is a p-channel MOSFET.

6. The circuit of claim 1, wherein the first electronic switch is a metal-oxide-semiconductor field effect transistor (MOSFET), the control terminal and the first and second terminals of the first electronic switch are corresponding to a gate, a source, and a drain of the MOSFET, respectively.

7. The circuit of claim 1, wherein the second electronic switch is a metal-oxide-semiconductor field effect transistor (MOSFET), the control terminal and the first and second terminals of the second electronic switch are corresponding to a gate, a source, and a drain of the MOSFET, respectively.

8. The circuit of claim 1, wherein the third electronic switch is a metal-oxide-semiconductor field effect transistor (MOSFET), the control terminal, the first and second terminals of the third electronic switch are corresponding to a gate, a source, and a drain of the MOSFET, respectively.

9. The circuit of claim 1, wherein the fourth electronic switch is a metal-oxide-semiconductor field effect transistor (MOSFET), the control terminal and the first and second terminals of the fourth electronic switch are corresponding to a gate, a source, and a drain of the MOSFET, respectively.

10. The circuit of claim 1, wherein the fifth electronic switch is a bipolar junction transistor (BJT) transistor, the control terminal and the first and second terminals of the sixth electronic switch are corresponding to a base, a collector, and an emitter of the BJT transistor, respectively.

* * * * *